(12) United States Patent
Cho et al.

(10) Patent No.: US 7,615,967 B2
(45) Date of Patent: Nov. 10, 2009

(54) METHOD AND APPARATUS OF ESTIMATING STATE OF HEALTH OF BATTERY

(75) Inventors: Il Cho, Daejeon (KR); Do Youn Kim, Daejeon (KR); Do Yang Jung, Hwaseong-si (KR)

(73) Assignee: LG Chem, Ltd. (KR)

( * ) Notice: Subject to any disclaimer, the term of this patent is extended or adjusted under 35 U.S.C. 154(b) by 344 days.

(21) Appl. No.: 11/479,910

(22) Filed: Jun. 30, 2006

(65) Prior Publication Data

US 2007/0001679 A1 Jan. 4, 2007

(30) Foreign Application Priority Data

Jun. 30, 2005 (KR) .................... 10-2005-0057646

(51) Int. Cl.
*H02J 7/00* (2006.01)
*G01N 27/416* (2006.01)
*G08B 21/00* (2006.01)
*G01R 31/36* (2006.01)

(52) U.S. Cl. ................. 320/132; 320/133; 320/134; 324/429; 324/431; 340/636.1; 340/636.21; 702/63; 702/64

(58) Field of Classification Search .......... 320/132, 320/133; 324/429, 431; 702/63, 64
See application file for complete search history.

(56) References Cited

U.S. PATENT DOCUMENTS 6,157,169 A * 12/2000 Lee ......................... 320/132
6,469,512 B2 * 10/2002 Singh et al. ............... 324/426
6,668,247 B2 * 12/2003 Singh et al. .................. 706/2

* cited by examiner

*Primary Examiner*—Edward Tso
*Assistant Examiner*—Yalkew Fantu
(74) *Attorney, Agent, or Firm*—Cantor Colburn LLP

(57) ABSTRACT

Disclosed is a method and apparatus of estimating a state of health (SOH) of a battery using internal resistance, which has been found to act as a parameter exerting the greatest influence on the SOH of the battery. The method comprises the steps of: storing an SOH estimation table constructing SOH values corresponding to various values of internal resistance according to temperature and a state of charge (SOC) in a memory; performing measurement of the temperature and estimation of the SOC of the battery when a request is made to estimate the SOH; detecting the internal resistance value of the battery; and reading the SOH values corresponding to the measured temperature, the estimated SOC of the battery, and the detected internal resistance value of the battery from the SOH estimation table.

7 Claims, 3 Drawing Sheets

FIG. 1

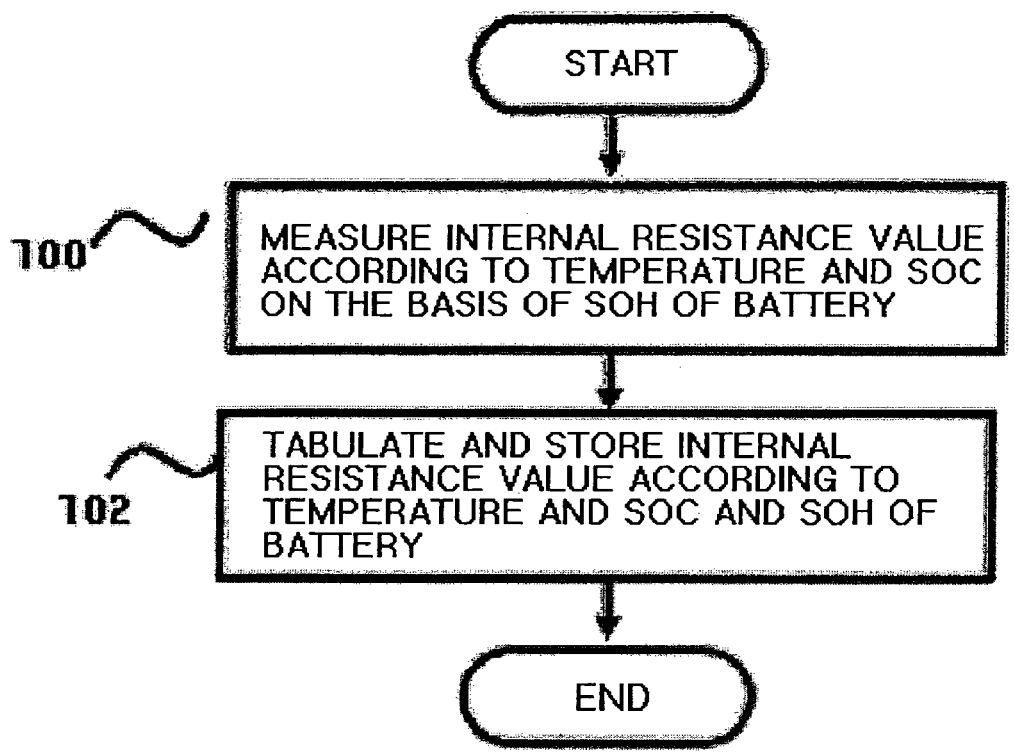

FIG. 2

| TEMPERATURE | SOC | INTERNAL RESISTANCE OF BATTERY | SOH |
|---|---|---|---|
| 1st TEMPERATURE | 1st SOC | 1st INTERNAL RESISTANCE | 1st SOH |
| | 2nd SOC | 2nd INTERNAL RESISTANCE | 2nd SOH |
| | ... | ... | ... |
| | N-th SOC | N-th INTERNAL RESISTANCE | N-th SOH |
| 2nd TEMPERATURE | (N+1)-th SOC | (N+1)-th INTERNAL RESISTANCE | (N+1)-th SOH |
| | (N+2)-th SOC | (N+2)-th INTERNAL RESISTANCE | (N+2)-th SOH |
| | ... | ... | ... |
| | (N+N)-th SOC | (N+N)-th INTERNAL RESISTANCE | (N+N)-th SOH |
| ... | ... | ... | ... |
| M-th TEMPERATURE | (M+1)-th SOC | (M+1)-th INTERNAL RESISTANCE | (M+1)-th SOH |
| | (M+2)-th SOC | (M+2)-th INTERNAL RESISTANCE | (M+2)-th SOH |
| | ... | ... | ... |
| | (M+M)-th SOC | (M+M)-th INTERNAL RESISTANCE | (M+M)-th SOH |

US 7,615,967 B2

METHOD AND APPARATUS OF ESTIMATING STATE OF HEALTH OF BATTERY

This application claims the benefit of the filing date of Korean Patent Application No. 2005-57646, filed on Jun. 30, 2005, in the Korean Intellectual Property Office, the disclosure of which is incorporated herein in its entirety by reference.

TECHNICAL FIELD

The present invention relates to a method and apparatus of estimating a state of health (SOH) of a battery, and more particularly to a method of estimating a state of a battery depending on the lapse of time using internal resistance of the battery.

BACKGROUND ART

In general, electric vehicles or hybrid electric vehicles make use of electric energy stored in a battery as an energy source. As the battery for such vehicles, a lithium-ion polymer battery is mainly used, and is being intensively studied.

In the case of gasoline vehicles, their engines are driven using gasoline as a fuel, and thus they do not have big difficulty in measuring a quantity of fuel. However, in the case of the electric vehicles or hybrid electric vehicles, because the battery is used as their power sources, it is difficult to measure residual energy accumulated in the battery.

Meanwhile, information on how much the current energy is left and thus how far the current energy can cover in the future is very important to drivers of the electric vehicles or hybrid electric vehicles.

Specifically, because the electric vehicles or hybrid electric vehicles are driven by the energy charged in their batteries, it is very important to check a state of charge (SOC) of the battery. Thus, there are developed various techniques, which are intended to check the SOC of the battery during driving to notify information on, for instance, a drivable distance to the driver.

Further, there are made various attempts to appropriately set an initial value of the SOC of the battery prior to the driving of the vehicle.

At this time, the initial value of the SOC is usually set with reference to open circuit voltage (OCV). This method is premised that the OCV is not varied according to an environment and serves as an absolute reference value of the SOC. However, according to various tests and papers, it turns out that the OCV is varied depending on temperature and time, rather than not varied according to an environment.

Meanwhile, in addition to the SOC as mentioned above, as an index for indicating the state of the battery for the electric vehicle, a concept of state of health (SOH) is used. More specifically, the battery has different property with the lapse of time. That is, an aging effect takes place. It is the SOH that is to detect a current state of the battery by predicting an aging degree in advance. Currently, unlike the estimation of the SOC, there is no definition of the SOH, as well as its accurate estimation method. Thus, there are proposed various methods alone.

For example, in order to measure factors indicating the SOH, necessary tests are carried out at laboratories or maintenance shops for measuring the SOC of the battery and other factors prior to mounting the battery to the vehicle or any other system. However, this approach takes much time, and thus only voltage of the mounted battery is measured in order to reduce the time. In this manner, the measurement of only the voltage of the battery is estimated that it is not considered to indicate a genuine state of load treatment capacity under various operation conditions required to perform the measurement in order to ensure reliable operation of the battery under the SOC of the battery or in the vehicle or other system to which the battery is mounted.

DISCLOSURE OF THE INVENTION

Therefore, the present invention has been made in view of the above-mentioned problems, and it is an objective of the present invention to provide a method and apparatus of estimating a state of health (SOH) of a battery using internal resistance, which has been found to act as a parameter exerting the greatest influence on the SOH of the battery.

According to an aspect of the present invention, there is provided a method of estimating a state of health (SOH) of a battery. The method comprises the steps of: storing an SOH estimation table constructing SOH values corresponding to various values of internal resistance according to temperature and a state of charge (SOC) in a memory; performing measurement of the temperature and estimation of the SOC of the battery when a request is made to estimate the SOH; detecting the internal resistance value of the battery; and reading the SOH values corresponding to the measured temperature, the estimated SOC of the battery, and the detected internal resistance value of the battery from the SOH estimation table.

BRIEF DESCRIPTION OF THE DRAWINGS

The foregoing and other objects, features and advantages of the present invention will become more apparent from the following detailed description when taken in conjunction with the accompanying drawings in which:

FIG. 1 is a flowchart illustrating a process of constructing a state of health (SOH) estimation table according to an exemplary embodiment of the present invention;

FIG. 2 illustrates an SOH estimation table according to an exemplary embodiment of the present invention;

BEST MODE FOR CARRYING OUT THE INVENTION

Reference will now be made in detail to the exemplary embodiments of the present invention.

Description will be made with reference to FIG. 1 regarding a process of constructing a state of health (SOH) estimation table according to an exemplary embodiment of the present invention.

In order to construct the SOH estimation table, a tester measures internal resistance values of a battery according to temperature and a state of charge (SOC) of the battery on the basis of an SOH of the battery (S100).

At this time, the temperature and the SOC, i.e. environments where the internal resistance values are measured, fall within actual operation ranges of the temperature and the SOC of a specified battery.

Further, instead of direct measurement of the internal resistance values, voltage and current according to the temperature and the SOC are measure, and then the internal resistance values are preferably calculated from the measured values of the voltage and the current.

Here, the measurement of the battery internal resistance values according to the temperature and the SOC on the basis of the SOH of the battery can be carried out by dividing the SOH into five steps, and then repeating the measurement of the battery internal resistance values according to the temperature and the SOC in each step.

As mentioned above, when the measurement of the battery internal resistance values according to the temperature and the SOC is completed in each step of the SOH, the tester constructs the SOH estimation table on the basis of each measurement result (S102).

In the SOH estimation table, different SOH values are each mapped according to the temperature, the SOC, and the battery internal resistance value, as shown in FIG. 2.

The SOH estimation table is used when the SOH of the corresponding battery being in service is estimated.

Figure 3:
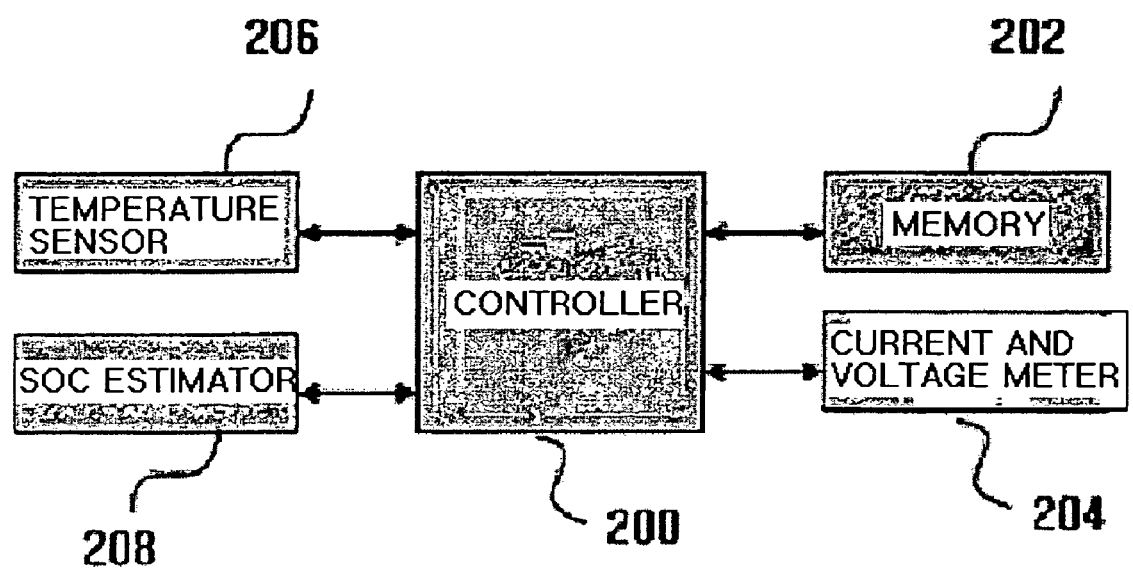
FIG. 3 illustrates an apparatus of estimating an SOH according to an exemplary embodiment of the present invention.

The construction of an apparatus of estimating the SOH using the SOH estimation table will be described with reference to FIG. 3.

The SOH estimation apparatus comprises a controller 200, a memory 202, a current and voltage meter 204, a temperature sensor 206, and a SOC estimator 208.

According to an exemplary embodiment of the present invention, the controller 200 controls the SOH estimation apparatus on the whole, measures temperature, SOC, and internal resistance, and reads SOH values corresponding to the measured values from the SOH estimation table.

According to an exemplary embodiment of the present invention, the memory 202 stores various pieces of information including a processing program of the controller 200, and particularly the SOH estimation table.

The current and voltage meter 204 measures current and voltage according to the control of the controller 200, and makes it possible to calculate the internal resistance of the battery. Here, the voltage and the current are measured for one second in real time while the battery is used, for example while the vehicle operates. In general, the internal resistance of the battery is to sum up impedance such as direct current (DC) resistance, spreading resistance etc., and is much difficult to measure in real time. For this reason, it is good to measure only a component of pure DC resistance. It is preferable to measure the resistance within a rapid time, but the measurement time is arbitrarily set to one second in consideration of hardware and a calculation time of other information.

The temperature sensor 206 senses temperature according to the control of the controller 200, and provides the sensed result to the controller 200.

The SOC estimator 208 estimates an SOC according to the control of the controller 200, and provides the estimated result to the controller 200.

Figure 4:
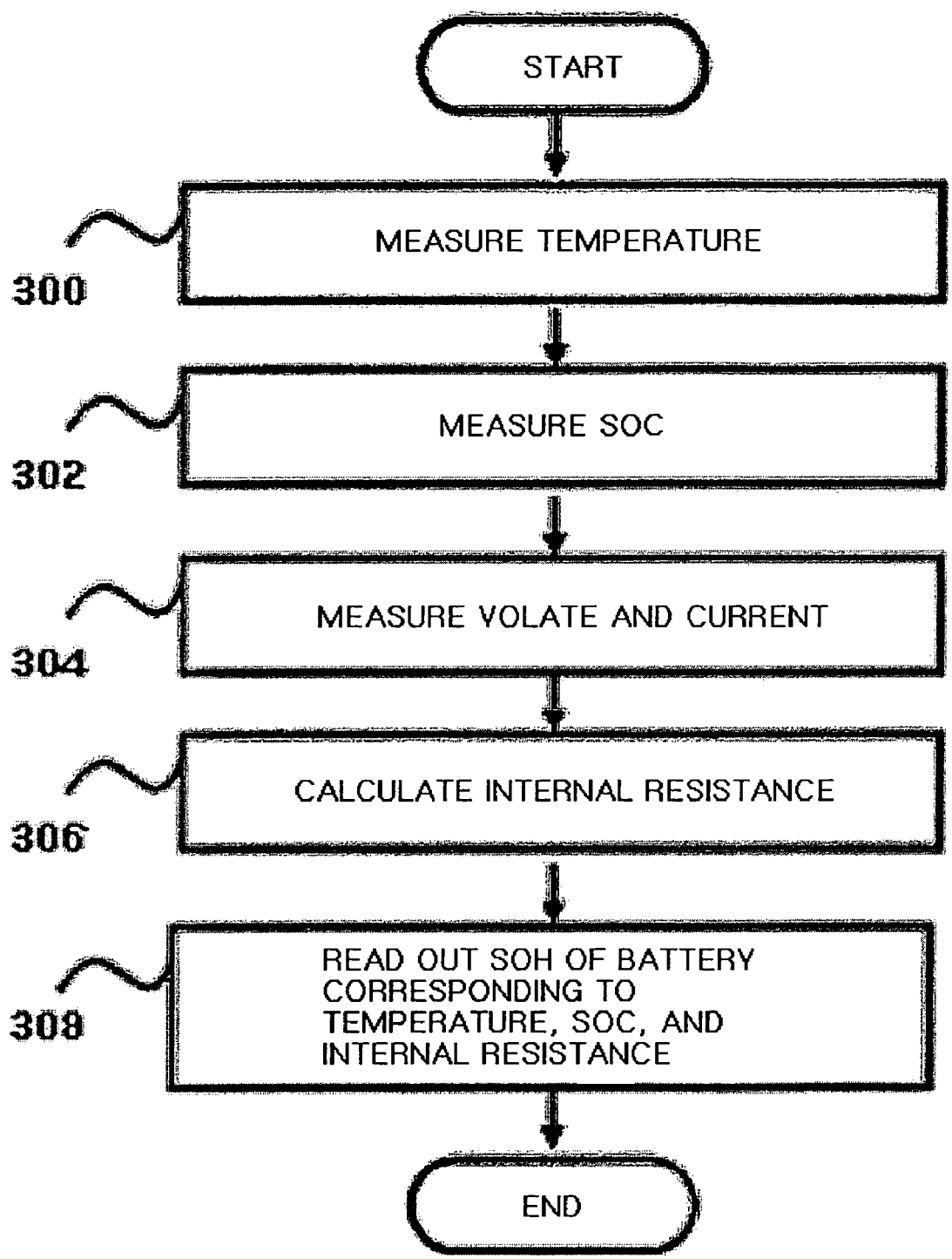
FIG. 4 is a flowchart illustrating a method of estimating an SOH according to an exemplary embodiment of the present invention.

Now, an SOH estimation method, which can be applied to the SOH estimation apparatus, according to an exemplary embodiment of the present invention will be described with reference to FIG. 4.

When SOH estimation is requested, the controller 200 measures temperature, SOC, current, and voltage through the temperature sensor 206, the SOC estimator 208, and current and voltage meter 204 (S300, S302, and S304).

Thereafter, the controller 200 calculates internal resistance of the battery using the measured current and voltage (S306).

When the calculation of the internal resistance is completed, the controller 200 reads SOH values corresponding to the measured temperature and SOC, and the calculated internal resistance from the SOH estimation table stored in the memory 202. By reading out the SOH values, the SOH estimation of the battery based on the SOH estimation request is completed.

As described above, the SOH can be estimated using the internal resistance, which has been found to act as a parameter exerting the greatest influence on the SOH of the battery.

INDUSTRIAL APPLICABILITY

As can be seen from the foregoing, according to the present invention, by detecting each SOH, temperature, SOC, and internal resistance through tests to construct the SOH estimation table, and reading out the SOH corresponding to the internal resistance measured in real time during the actual use of the battery through the SOH estimation table, the SOH of the corresponding battery can be easily detected.

Further, the SOH of the battery, which is impossible to directly detect and is very strong in nonlinearity, can be estimated relatively and accurately.

In addition, the SOH of the battery can be estimated without adding a stand-alone device to a battery management system (BMS) in order to estimate the SOH of the battery.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

The invention claimed is:

1. A method of estimating a state of health (SOH) of a battery, the method comprising the steps of:
   storing an SOH estimation table having SOH values, internal resistance values, temperature values, and state of charge (SOC) values in a memory, each SOH value having a corresponding internal resistance value, a corresponding temperature value and a corresponding SOC value;
   performing measurement of a first temperature and estimation of a first estimated SOC of the battery when a request is made to estimate the SOH;
   detecting a first internal resistance of the battery; and
   reading a first SOH value corresponding to the measured first temperature, the first estimated SOC of the battery, and the detected first internal resistance of the battery from the SOH estimation table.

2. The method according to claim 1, wherein the first internal resistance value is calculated based on a voltage and a current of the battery, which are measured for a predetermined time during actual operation of the battery.

3. The method according to claim 1, wherein the SOH estimation table is constructed with values within actual operation temperature and SOC ranges of the battery.

4. An apparatus of estimating a state of health (SOH) of a battery, comprising:
   a memory storing an SOH estimation table having SOH values, internal resistance values, temperature values, and state of charge (SOC) values, each SOH value having a corresponding internal resistance value, a corresponding temperature value and a corresponding SOC value;
   a current and voltage meter measuring a current and a voltage of the battery;
   a temperature meter measuring a first temperature;
   an SOC estimator estimating a first SOC of the battery; and
   a controller performing measurement of the first temperature utilizing the temperature meter and estimation of the first SOC of the battery through the SOC estimator when a request is made to estimate the SOH, measuring the current and voltage of the battery utilizing the current and voltage meter, calculating a first internal resistance value from the measured current and voltage, and reading a first SOH value corresponding to the measured first temperature, the estimated first SOC of the battery, and the calculated first internal resistance value of the battery from the SOH estimation table.

5. The apparatus according to claim 4, wherein the SOH estimation table is constructed with values within actual operation temperature and SOC ranges of the battery.

6. The method according to claim 1, wherein reading the first SOH value comprises reading the first SOH value from the SOH estimation table when the measured first temperature corresponds to a temperature value in the SOH estimation table associated with the first SOH value, the first estimated SOC of the battery corresponds to an SOC value in the SOH estimation table associated with the first SOH value, and the detected first internal resistance of the battery corresponds to an internal resistance value in the SOH estimation table associated with the first SOH value.

7. The apparatus according to claim 4, wherein the controller reads the first SOH value from the SOH estimation table when the measured first temperature corresponds to a temperature value in the SOH estimation table associated with the first SOH value, the first estimated SOC of the battery corresponds to an SOC value in the SOH estimation table associated with the first SOH value, and the detected first internal resistance of the battery corresponds to an internal resistance value in the SOH estimation table associated with the first SOH value.

* * * * *